(12) United States Patent
Chiang et al.

(10) Patent No.: US 8,735,958 B1
(45) Date of Patent: May 27, 2014

(54) MULTI-LAYER POLYSILICON SUPPRESSION OF IMPLANT SPECIES PENETRATION

(71) Applicant: Macronix International Co., Ltd., Hsinchu (TW)

(72) Inventors: Chun Ling Chiang, Hsinchu (TW); Wen-Ming Chang, Zhunan Township (TW); Chun-Ming Cheng, Hsinchu (TW); Ling-Wuu Yang, Hsinchu (TW); Kuang-Chao Chen, Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 13/728,783

(22) Filed: Dec. 27, 2012

(51) Int. Cl.
| | | |
|---|---|---|
| *H01L 29/76* | (2006.01) | |
| *H01L 29/788* | (2006.01) | |
| *G11C 11/34* | (2006.01) | |
| *H01L 21/28* | (2006.01) | |
| *H01L 29/51* | (2006.01) | |
| *G11C 16/04* | (2006.01) | |

(52) U.S. Cl.
CPC ........ *H01L 21/28273* (2013.01); *H01L 29/513* (2013.01); *G11C 16/0416* (2013.01)
USPC ........... 257/314; 257/315; 257/316; 257/324; 257/E21.309; 257/E29.3; 257/E29.165; 365/185.02; 365/185.26; 438/263; 438/593

(58) Field of Classification Search
CPC ............ H01L 21/28273; H01L 29/513; G11C 16/0416
USPC .................. 257/314, 315, 316, 324, E21.309, 257/E29.309, E29.3; 365/185.02, 185.26; 438/263, 593
See application file for complete search history.

(56) References Cited

U.S. PATENT DOCUMENTS

| 7,042,043 B2 * | 5/2006 | Forbes et al. ................. 257/314 |
| 2005/0167734 A1 * | 8/2005 | She et al. ...................... 257/321 |
| 2006/0131633 A1 * | 6/2006 | Bhattacharyya ............. 257/314 |
| 2009/0059676 A1 * | 3/2009 | Lai et al. .................. 365/185.28 |

* cited by examiner

*Primary Examiner* — Dao H Nguyen
(74) *Attorney, Agent, or Firm* — Baker & McKenzie LLP

(57) ABSTRACT

A blocking semiconductor layer minimizes penetration of implant species into a semiconductor layer beneath the blocking semiconductor layer. The blocking semiconductor layer may have grains with relatively fine or small grain sizes and/or may have a dopant in a relatively low concentration to minimize penetration of implant species into the semiconductor layer beneath the blocking semiconductor layer.

24 Claims, 4 Drawing Sheets

MULTI-LAYER POLYSILICON SUPPRESSION OF IMPLANT SPECIES PENETRATION

TECHNICAL FIELD

This disclosure relates to semiconductor devices and, more specifically, relates to semiconductor devices having multiple polysilicon layers for suppressing the penetration of implant species.

BACKGROUND

Implant species are used in the manufacture of semiconductor devices as dopants. For example, boron is often implanted into various layers of semiconductor devices as a dopant.boron often penetrates into the floating gates of the semiconductor devices, which results in a number of problems, including, but not limited to, threshold voltages ($V_t$) shifting within the semiconductor devices' cells, reducing the reliability of the devices. Accordingly, suppressing implant species' penetration into floating gates of semiconductor devices is desired.

SUMMARY

A semiconductor device may include a blocking semiconductor layer with a first dopant in a first concentration and a second dopant, and a first polysilicon layer disposed on the blocking semiconductor layer. The first polysilicon layer may including the first dopant in a second concentration, and the first concentration is less than the second concentration.

According to another aspect a semiconductor device may include a blocking semiconductor layer having grains with grain sizes in a first size range. The semiconductor may further include a first polysilicon layer disposed on the blocking semiconductor layer. The first polysilicon layer may have grains with grain sizes of a second size range. The grains with grain sizes in the first size range are smaller than the grains with grain sizes in the second size range. The blocking semiconductor layer may further include a first and second dopant. The first dopant has a first concentration, the first polysilicon layer includes the first dopant having a second concentration, and the first concentration is less than the second concentration.

According to another aspect, a method for manufacturing a semiconductor device may include providing a blocking semiconductor layer comprising grains with grain sizes in a first size range, disposing a first polysilicon layer over the blocking semiconductor layer, the first polysilicon layer having grains with grain sizes of a second size range, implanting the semiconductor device with an implant species. The blocking semiconductor layer may minimizes penetration of the implant species into a second polysilicon layer of the semiconductor device. The grains with grain sizes in the first size range may be smaller than the grains with grain sizes in the second size range.

DETAILED DESCRIPTION

Figure 1:
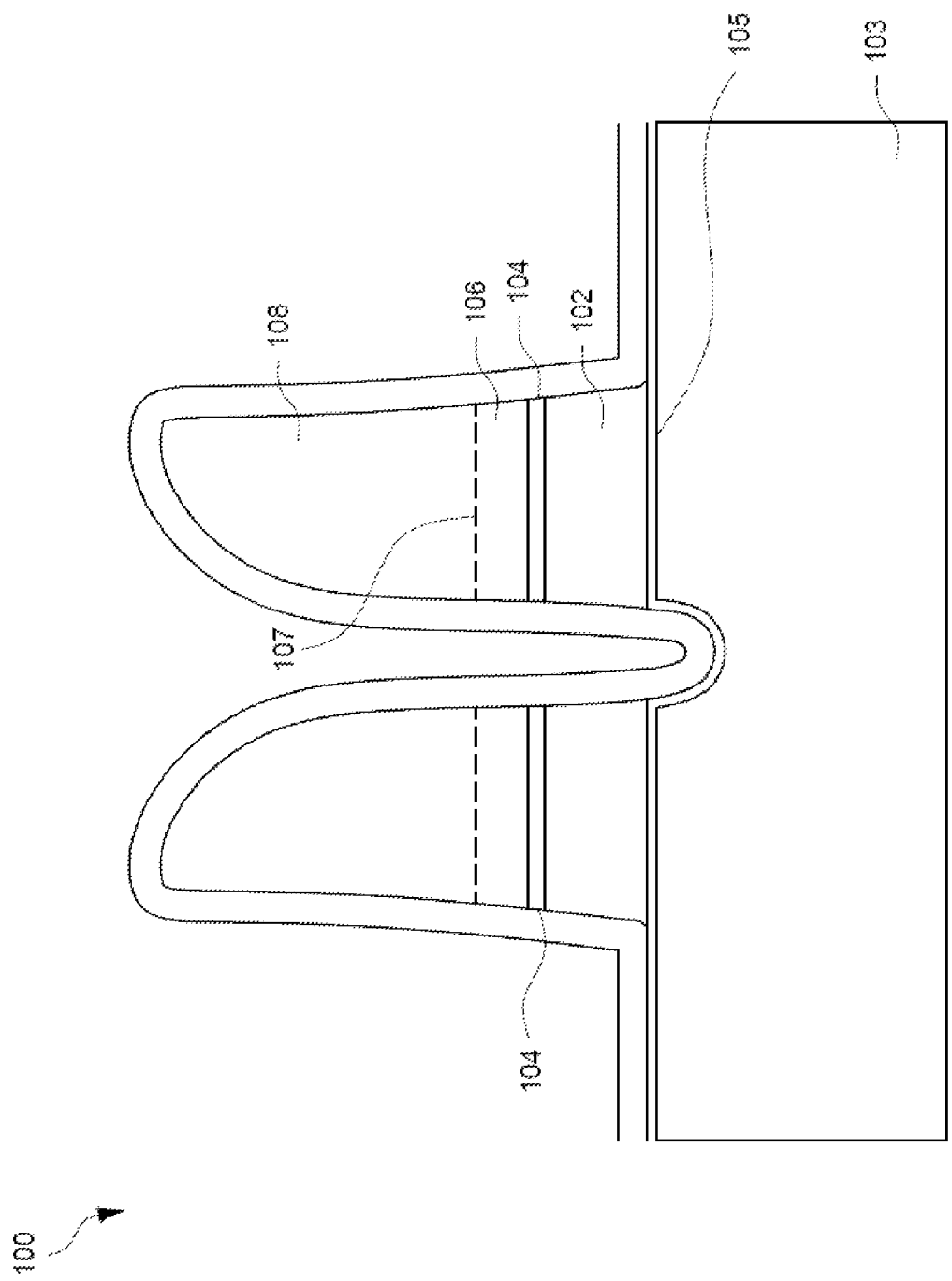
FIG. 1 is a schematic diagram illustrating a cross section semiconductor device, in accordance with the present disclosure.

FIG. 1 is a schematic diagram of a semiconductor device 100. The semiconductor device 100 may include a substrate 103, first dielectric layer 105, second polysilicon layer 102, second dielectric layer 104, blocking semiconductor layer 106, and first polysilicon layer 108. In an embodiment, the first dielectric layer 105 may be an oxide layer in which charges tunnel through during operation of the semiconductor device 100. The first polysilicon layer 108 may be a control gate structure, and the second polysilicon layer 102 may be a floating gate structure. The blocking semiconductor layer 106 may be a polysilicon layer. The second dielectric layer 104 may comprise an oxide layer or an oxide-nitride-oxide laminate layer. The second dielectric layer 104 is disposed over the second polysilicon layer 102, and the blocking semiconductor layer 106 is disposed over the second dielectric layer 104. The blocking semiconductor layer 106 may allow for minimizing implant species penetration into the second polysilicon layer 102.

Generally speaking, the blocking semiconductor layer 106 minimizes or substantially prevents implant species penetration into a layer beneath the blocking semiconductor layer 106 of a semiconductor device 100. The blocking semiconductor layer 106 may be used in any scenario in which an implant species diffusion should be suppressed—especially when an implant species has relatively small atomic weight elements (e.g., phosphorous and boron). For example, the blocking semiconductor layer 106 may be used to minimize or substantially prevent implantation species from penetrating an n-bit memory cell when an implantation species is being implanted into a control gate.

An other embodiments, the blocking semiconductor layer 106 may include multiple layers to enhance minimizing and preventing dopant penetration into a layer beneath the blocking semiconductor layer 106.

The blocking semiconductor layer 106 may be a variety of types of polysilicon. For example, the blocking semiconductor layer 106 may be a furnace-type or a single wafer type polysilicon. As another example, the blocking semiconductor layer 106 may be un-doped or carbon-doped polysilicon. As still another example, the blocking semiconductor layer 106 may be amorphous polysilicon or crystalline polysilicon. Thus, a variety of combinations for the blocking semiconductor layer 106 are possible, including, but not limited to, furnace type, un-doped amorphous polysilicon; furnace type, un-doped crystalline polysilicon; single wafer, un-doped amorphous polysilicon; single wafer, un-doped crystalline polysilicon; and single wafer, carbon-doped amorphous polysilicon.

The furnace-type, un-doped amorphous polysilicon may be made in a furnace having a temperature of approximately 520° C. The furnace-type, un-doped crystalline polysilicon may be made in a furnace having a temperature of approximately 620° C.

In an embodiment, the blocking semiconductor layer 106 includes a first dopant and a second dopant. The first dopant has a first concentration. The first polysilicon layer 108 includes a first dopant having a second concentration. The first concentration is less than approximately 1E17 atom/cm3. The second concentration is substantially in the range of 1E22 to 1E17 atom/cm3.

In an embodiment, the blocking semiconductor layer 106 has a depth of approximately 300 Å, the first polysilicon layer 108 has a depth of approximately 2000 Å, and the second dielectric layer 104 has a depth of approximately 1000 Å.

In an embodiment, the implant species is boron, and the boron penetration into the floating gate of the semiconductor device is in the range of approximately 1E15~1E18 atom/cm3.

An interface 107 is defined between the blocking semiconductor layer 106 and the first polysilicon layer 108, which may further minimize boron penetration into the second polysilicon layer 102 of the semiconductor device 100.

Minimizing or substantially preventing implantation species from penetrating the second polysilicon layer 102 of the semiconductor device 100 allows for minimizing or substantially preventing unwanted threshold voltage shifting in the semiconductor device 100.

In another embodiment, the blocking semiconductor layer 106 has polysilicon grains with grain sizes in a first size range, and the first polysilicon layer 108 has polysilicon grains with grain sizes of a second size range. In an embodiment, the polysilicon grain size in the first size range is approximately less than 5 nm. The polysilicon grain size in the second size range is approximately 10-20 nm.

In an exemplary embodiment, the polysilicon grains in the first size range are smaller than in the second size range. This may allow for minimal implant species 110 to penetrate into the floating gate 102. In an embodiment, an interface between the blocking semiconductor layer 106 and the first polysilicon layer 108 further allows for minimal implant species to penetrate into the second polysilicon layer 102.

In addition, having a blocking semiconductor layer 106 with grain sizes in the first size range may allow for the polysilicon to more fully fill in trenches of the semiconductor device 100, substantially eliminating voids in the trenches.

In another embodiment, the blocking semiconductor layer 106 may include a first and second dopant as well as have polysilicon grains in a first size range. The first dopant may be of a first concentration. The first polysilicon layer 108 may have a first dopant in a second concentration as well as having polysilicon grains in a second size range.

Figure 2:
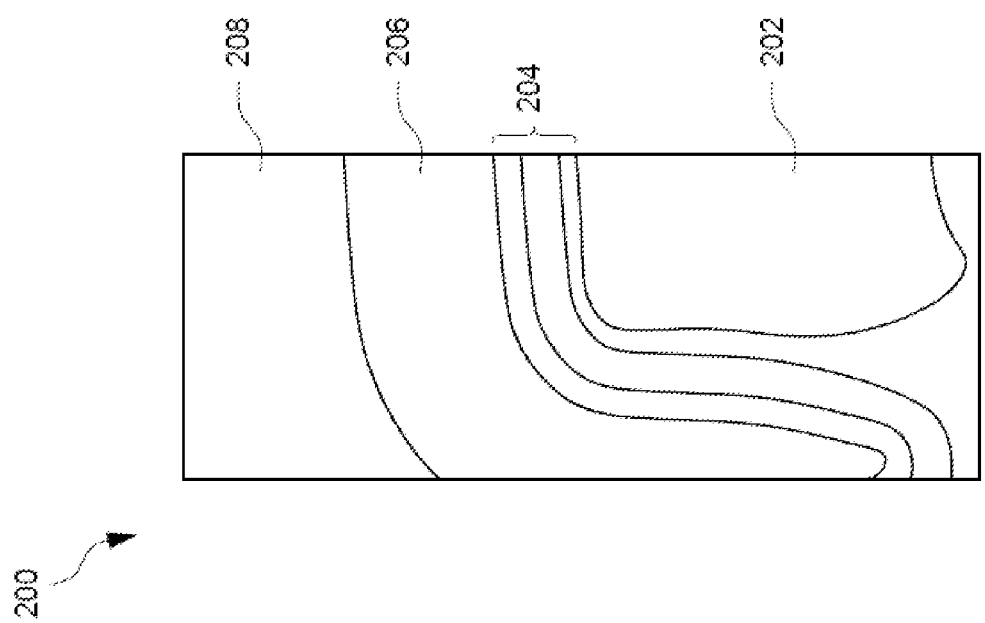
FIG. 2 is a schematic diagram illustrating a cross section of another semiconductor device, in accordance with the present disclosure.

FIG. 2 is a schematic diagram illustrating a cross section of a semiconductor device 200. The semiconductor device 200 includes a first polysilicon layer 208 and a blocking semiconductor layer 206. In an embodiment, the first polysilicon layer 208 is a control gate structure. The semiconductor device 200 may further include a second polysilicon layer 202. The second polysilicon layer 202 may be a floating gate structure. The semiconductor polysilicon layer 206 may allow for minimal implant species—e.g., boron—to penetrate into the second polysilicon layer 202. The semiconductor device 200 may further include an oxide-nitride-oxide layer 204 disposed between the second polysilicon layer 202 and the blocking semiconductor layer 206.

Figure 3C:
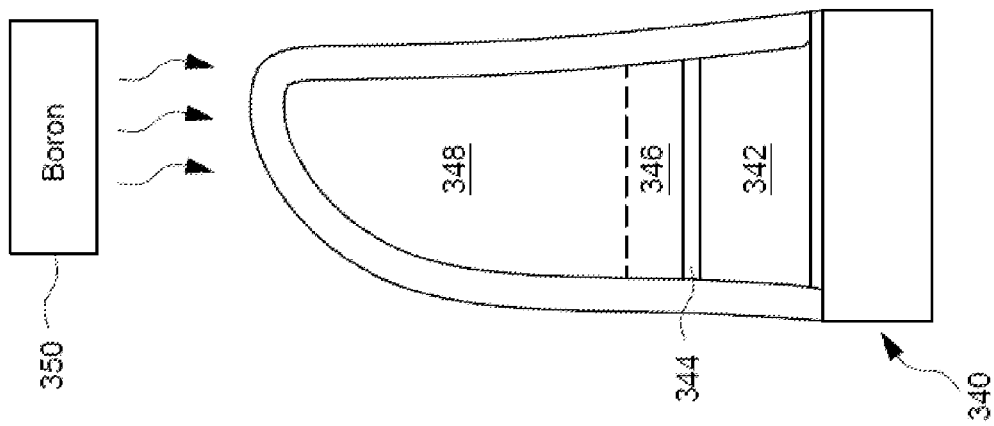
FIGS. 3A, 3B, and 3C are schematic diagrams illustrating various embodiments of semiconductor devices, in accordance with the present disclosure.
Figure 3B:
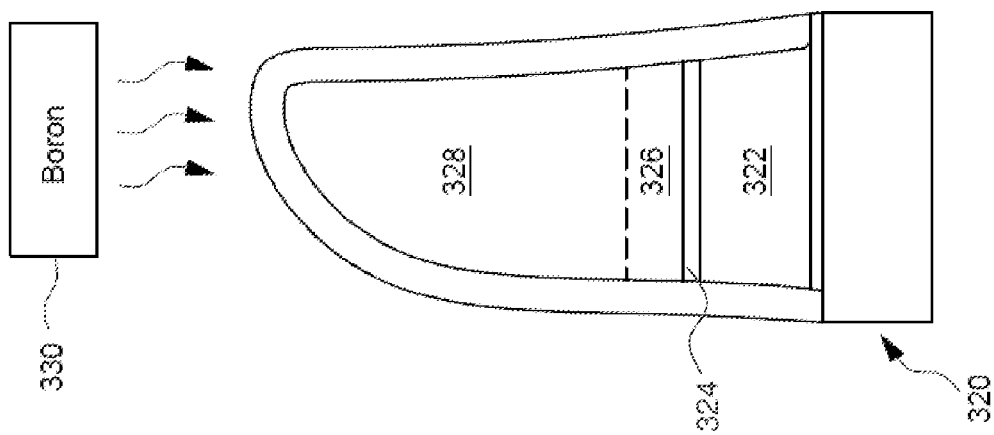
Figure 3A:
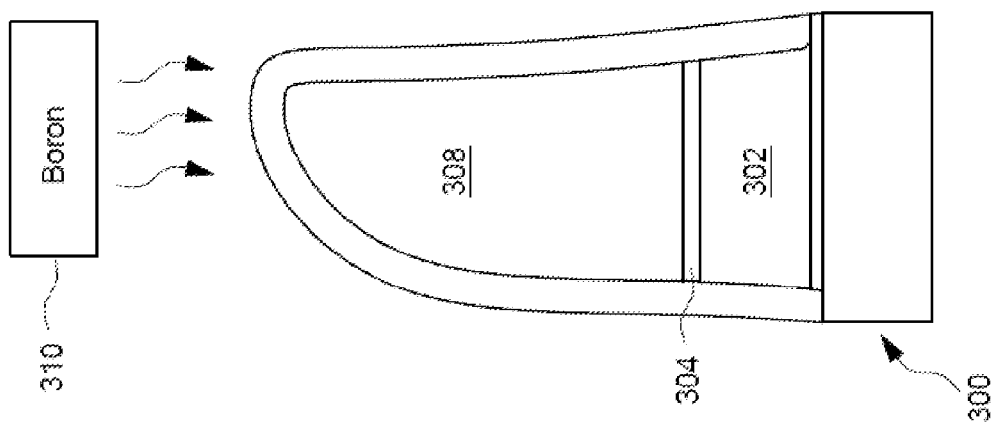

FIGS. 3A, 3B, and 3C are schematic diagrams illustrating various embodiments of semiconductor devices 300, 320, 340, respectively. Referring first to FIG. 3A, semiconductor device 300 includes a second polysilicon layer 302, dielectric layer 304, and a first polysilicon layer 308. The first polysilicon layer 308 has a depth of approximately 2300 Å, and the dielectric layer 304 has a depth of approximately 1000 Å. An implantation species 310 is implanted into the semiconductor device 300.

Referring now to FIG. 3B, semiconductor device 320 includes a second polysilicon layer 322, dielectric layer 324, blocking semiconductor layer 326 and first polysilicon layer 328. In an embodiment, the blocking semiconductor layer 326 is made of Disilane ($Si_2H_6$) and Silane ($SiH_4$). The first polysilicon layer 328 has a depth of approximately 2000 Å, the blocking semiconductor layer 326 has a depth of approximately 300 Å, and the dielectric layer 324 has a depth of approximately 1000 Å. Thus the total depth of the dielectric layer 324, blocking semiconductor layer 326 and first polysilicon layer 328 of the semiconductor device 320 in FIG. 3B is comparable to the dielectric layer 304 and first polysilicon layer 308 of the semiconductor device 300 in FIG. 3A. Referring back to FIG. 3B, an implantation species 330 is implanted into the semiconductor device 320.

Referring now to FIG. 3C, semiconductor device 340 includes a second polysilicon layer 342, dielectric layer 344, blocking semiconductor layer 346 and first polysilicon layer 348. In an embodiment, the blocking semiconductor layer 326 is made of Disilane ($Si_2H_6$) and $C_2H_4$—$SiH_4$. The first polysilicon layer 348 has a depth of approximately 2000 Å, the blocking semiconductor layer 346 has a depth of approximately 300 Å, and the dielectric layer 344 has a depth of approximately 1000 Å. Thus the total depth of the dielectric layer 344, blocking semiconductor layer 346 and first polysilicon layer 348 of the semiconductor device 340 in FIG. 3C is comparable to both the total depth of the dielectric layer 304 and first polysilicon layer 308 of the semiconductor device 300 in FIG. 3A and the total depth of the dielectric layer 324, blocking semiconductor layer 326 and first polysilicon layer 328 of the semiconductor device 320 in FIG. 3B. Referring back to FIG. 3C, an implantation species 350 is implanted into the semiconductor device 340.

Figure 4:
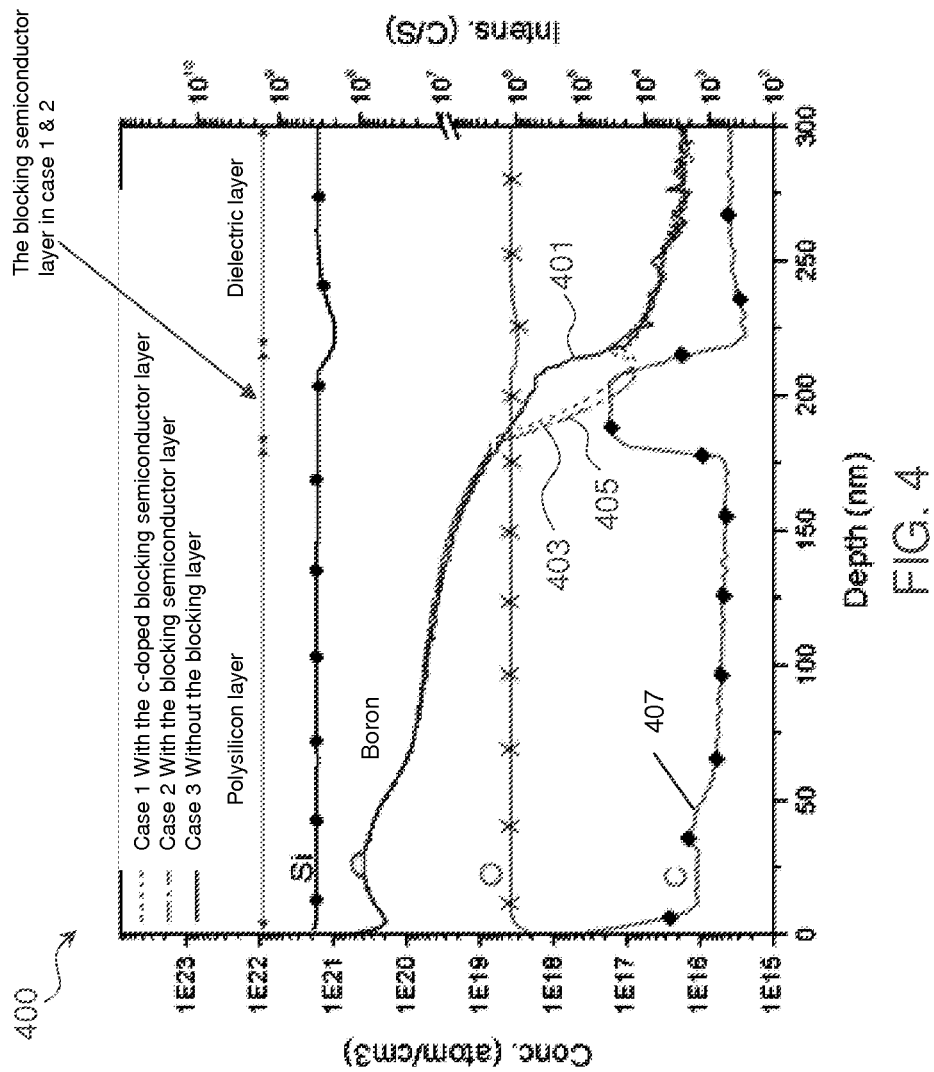
FIG. 4 is a graphical diagram illustrating boron penetration, in accordance with the present disclosure.

FIG. 4 is a graphical diagram illustrating implantation species penetration with respect to the embodiments described above in relation to FIGS. 3A, 3B, and 3C. The implantation species used is boron. The concentration of the implantation species (in atoms/$cm^3$) is shown in relation to a semiconductor device's depth (in nm). Relationship 401 (case 3) corresponds to the semiconductor device 300—without a blocking semiconductor layer—as shown in FIG. 3A. Relationship 403 (case 1) corresponds to the semiconductor device 340 shown in FIG. 3C. Line 407 (case 1) also shows that a concentration of carbon peaks in the blocking semiconductor layer for the semiconductor device 340. Relationship 405 (case 2) corresponds to the semiconductor device 320 shown in FIG. 3B. Thus, FIG. 4 shows that the semiconductor devices 320, 340 including blocking semiconductor layers 326, 346 (as shown in FIGS. 3B, 3C) allow for a substantially lower concentration of implantation species at a greater depth in the semiconductor device. Thus, implantation species—e.g., boron—penetration may be substantially blocked by various blocking semiconductor layers (e.g., $Si_2H_6$+$SiH_4$; or $Si_2H_6$+$C_2H_4$—$SiH_4$).

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device, comprising:
   a blocking semiconductor layer including a first dopant in a first concentration and a second dopant; and
   a first polysilicon layer disposed on the blocking semiconductor layer, the first polysilicon layer including the first dopant in a second concentration, wherein the first concentration is less than the second concentration.

2. The semiconductor device of claim 1, wherein the first concentration is less than ~1E17 atom/cm3, and wherein the second concentration is substantially in the range of 1E22 to 1E17 atom/cm3.

3. The semiconductor device of claim 1, wherein the blocking semiconductor layer has a depth of approximately 300 Å, and the first polysilicon layer has a depth of approximately 2000 Å.

4. The semiconductor device of claim 1, further comprising:
   a second polysilicon layer; and
   a dielectric layer disposed over the second polysilicon layer, wherein the blocking semiconductor layer is disposed over the dielectric layer.

5. The semiconductor device of claim 4, wherein the boron penetration into the second polysilicon layer is in the range of 1E15-1E18 atom/cm3.

6. The semiconductor device of claim 4, wherein the first polysilicon layer is a control gate, and wherein the second polysilicon layer is a floating gate.

7. The semiconductor device of claim 1, wherein the first dopant is boron and the second dopant is carbon.

8. The semiconductor device of claim 1, wherein the dielectric layer is an oxide layer.

9. The semiconductor device of claim 1, wherein the dielectric layer is an oxide-nitride-oxide layer.

10. A semiconductor device, comprising:
    a blocking semiconductor layer comprising grains with grain sizes in a first size range; and
    a first polysilicon layer disposed on the blocking semiconductor layer, the first polysilicon layer having grains with grain sizes of a second size range,
    wherein the grains with grain sizes in the first size range are smaller than the grains with grain sizes in the second size range.

11. The semiconductor device of claim 10, wherein the first size range is less than approximately 5 nm.

12. The semiconductor device of claim 10, wherein the second size range is approximately 10 to 20 nm.

13. The semiconductor device of claim 10, further comprising:
    a second polysilicon layer; and
    a dielectric layer disposed over the second polysilicon layer, wherein the blocking semiconductor layer is disposed over the dielectric layer.

14. The semiconductor device of claim 13, wherein the first polysilicon layer is a control gate, and wherein the second polysilicon layer is a floating gate.

15. The semiconductor device of claim 13, wherein the dielectric layer is an oxide layer.

16. The semiconductor device of claim 13, wherein the dielectric layer is an oxide-nitride-oxide laminated layer.

17. The semiconductor device of claim 10, wherein the blocking semiconductor layer includes a first and second dopant, the first dopant has a first concentration, the first polysilicon layer includes the first dopant having a second concentration, and the first concentration is less than the second concentration.

18. The semiconductor device of claim 17, wherein the first dopant is boron and the second dopant is carbon.

19. The semiconductor device of claim 10, wherein the blocking semiconductor layer comprises one of a furnace type amorphous polysilicon, a furnace type crystalline polysilicon, a single wafer amorphous polysilicon, and a single wafer crystalline polysilicon.

20. A method for manufacturing a semiconductor device, the method comprising:
    providing a blocking semiconductor layer comprising grains with grain sizes in a first size range;
    disposing a first polysilicon layer over the blocking semiconductor layer, the first polysilicon layer having grains with grain sizes of a second size range; and
    implanting the semiconductor device with an implant species, wherein the blocking semiconductor layer minimizes penetration of the implant species into a second polysilicon layer of the semiconductor device.

21. The method of claim 20, wherein the grains with grain sizes in the first size range are smaller than the grains with grain sizes in the second size range.

22. The semiconductor device of claim 20, wherein the first size range is less than approximately 5 nm, and wherein the second size range is approximately 10 to 20 nm.

23. The semiconductor device of claim 20, wherein an interface between the blocking semiconductor layer and the first polysilicon layer further allows for minimizing boron penetration into the second polysilicon layer.

24. The semiconductor device of claim 20, wherein the implant species penetration into the second polysilicon layer is substantially in the range of approximately 1E15 to 1E18 atom/cm3.

* * * * *